US006914471B2

(12) United States Patent
Chang et al.

(10) Patent No.: US 6,914,471 B2
(45) Date of Patent: Jul. 5, 2005

(54) METHOD AND APPARATUS FOR CONTROLLING A DUAL-SLOPE INTEGRATOR CIRCUIT TO ELIMINATE SETTLING TIME EFFECT

(75) Inventors: Tsin-Yuan Chang, Hsinchu (TW); Ming-Jun Hsiao, Taichung (TW); Jing-Reng Huang, Pingtung (TW)

(73) Assignee: National Tsing Hua University (TW)

( * ) Notice: Subject to any disclaimer, the term of this patent is extended or adjusted under 35 U.S.C. 154(b) by 0 days.

(21) Appl. No.: 10/748,580

(22) Filed: Dec. 30, 2003

(65) Prior Publication Data

US 2005/0024120 A1 Feb. 3, 2005

(30) Foreign Application Priority Data

Jul. 28, 2003 (TW) ........................................ 92120536 A

(51) Int. Cl.[7] ................................................. G06F 5/00
(52) U.S. Cl. ...................................... 327/344; 327/336
(58) Field of Search ................................. 327/170, 198, 327/334, 336, 344

(56) References Cited

U.S. PATENT DOCUMENTS 6,570,432 B2 * 5/2003 Denison ...................... 327/344

* cited by examiner

Primary Examiner—Kenneth B. Wells
(74) Attorney, Agent, or Firm—Cowan, Liebowitz & Latman, P.C.; Eugene L. Flanagan, III

(57) ABSTRACT

In a method and apparatus for controlling a dual-slope integrator circuit, a reset signal is provided to a reset input of the integrator circuit to maintain a reset state of an integrating capacitor for a predetermined reset time period in response to an original input signal. A delayed input signal is simultaneously generated by introducing a predetermined delay period into the original input signal, the delay period being longer than the reset time period. With reference to the original input signal and the delayed input signal, a trigger signal is provided to an integrator input of the integrator circuit for enabling charging operation of the integrating capacitor during a charging period that starts from the end of the reset time period and that terminates at a lagging edge of the delayed input signal.

18 Claims, 4 Drawing Sheets

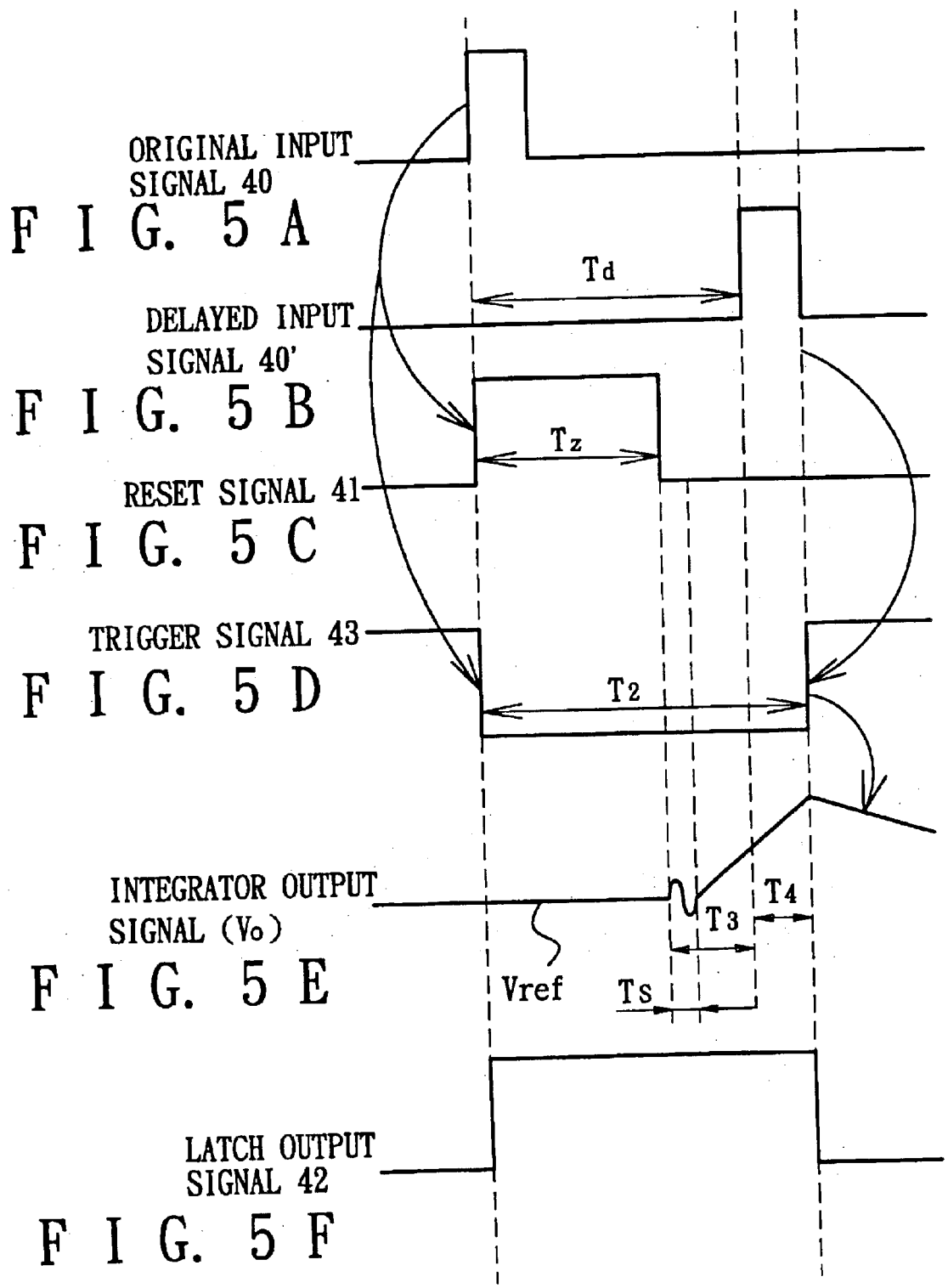

METHOD AND APPARATUS FOR CONTROLLING A DUAL-SLOPE INTEGRATOR CIRCUIT TO ELIMINATE SETTLING TIME EFFECT

CROSS-REFERENCE TO RELATED APPLICATION

This application claims priority of Taiwanese application no. 092120536, filed on Jul. 28, 2003.

BACKGROUND OF THE INVENTION

1. Field of the Invention

The invention relates to a method and apparatus for controlling a dual-slope integrator circuit, more particularly to a method and apparatus for controlling a dual-slope integrator circuit to eliminate settling time effect.

2. Description of the Related Art

Conventional dual-slope integrators are widely used in linear systems, such as analog-to-digital conversion, time interval measurement, etc. Referring to FIG. 1, a conventional dual-slope integrator 1 is shown to include an operational amplifier 10. As shown in FIG. 2, in operation, the dual-slope integrator 1 generally requires a settling time ($T_S$) before reaching a linear operating region ($T_L$) during which a stable output can be obtained from the operational amplifier 10. As such, as shown in FIG. 3, in a time interval measuring device 11, a control circuit 12 is used in controlling the dual-slope integrator 1 to eliminate the settling time effect. In this configuration, a digital clock signal and an analog input test signal must be inputted to the control circuit 12 for synchronization. However, the high-frequency digital clock signal can interfere with the analog input test signal and cannot be easily synchronized with the latter. In U.S. Pat. No. 6,137,749, there is disclosed a control circuit constructed from a finite state machine so as to solve the aforesaid synchronization problem between the digital clock signal and the analog input test signal. However, the control circuit proposed in the aforesaid patent is not only large and complicated, but also does not address the problems associated with the settling time of the dual-slope integrator and interference between the digital clock signal and the analog input test signal.

SUMMARY OF THE INVENTION

Therefore, the object of the present invention is to provide a method and apparatus for controlling a dual-slope integrator circuit so as to solve the above drawbacks associated with the prior art.

According to one aspect of the present invention, there is provided a method for controlling a dual-slope integrator circuit. The integrator circuit has an integrating capacitor, a reset input for receiving a reset signal that is used in maintaining a reset state of the integrating capacitor, and an integrator input for receiving a signal to be integrated. The method comprises the steps of:

a) in response to an original input signal, generating the reset signal that is provided to the reset input and that has a predetermined reset time period;

b) simultaneous with step a), generating a delayed input signal by introducing a predetermined delay period into the original input signal, the delay period being longer than the reset time period; and c) with reference to the original input signal and the delayed input signal, generating a trigger signal that is provided to the integrator input for enabling charging operation of the integrating capacitor during a charging period that starts from the end of the reset time period and that terminates at a lagging edge of the delayed input signal.

According to another aspect of the present invention, there is provided a method for controlling a dual-slope integrator circuit. The integrator circuit has an integrating capacitor, a reset input for receiving a reset signal that is used in maintaining a reset state of the integrating capacitor, and an integrator input for receiving a signal to be integrated. The method comprises the steps of:

a) in response to an original input signal, generating a trigger signal that is provided to the integrator input;

b) simultaneous with step a), generating the reset signal that is provided to the reset input and that has a predetermined reset time period such that charging operation of the integrating capacitor is enabled only at the end of the reset time period;

c) simultaneous with step a), generating a delayed input signal by introducing a predetermined delay period into the original input signal, the delay period being longer than the reset time period; and d) terminating generation of the trigger signal upon detection of a lagging edge of the delayed input signal.

According to yet another aspect of the present invention, there is provided an apparatus for controlling a dual-slope integrator circuit. The integrator circuit has an integrating capacitor, a reset input for receiving a reset signal that is used in maintaining a reset state of the integrating capacitor, and an integrator input for receiving a signal to be integrated. The apparatus comprises a one-shot circuit, a delay circuit, and a control circuit. The one-shot circuit is adapted to receive an original input signal and to generate the reset signal, that is provided to the reset input and that has a predetermined reset time period, in response to the original input signal. The delay circuit is adapted to receive the original input signal and to generate a delayed input signal by introducing a predetermined delay period into the original input signal, the delay period being longer than the reset time period. The control circuit is adapted to receive the original input signal and the delayed input signal and to generate a trigger signal that is provided to the integrator input for enabling charging operation of the integrating capacitor during a charging period that starts from the end of the reset time period and that terminates at a lagging edge of the delayed input signal.

According to a further aspect of the present invention, there is provided an apparatus for controlling a dual-slope integrator circuit. The integrator circuit has an integrating capacitor, a reset input for receiving a reset signal that is used in maintaining a reset state of the integrating capacitor, and an integrator input for receiving a signal to be integrated. The apparatus comprises a control circuit, a one-shot circuit, and a delay circuit. The control circuit is adapted to receive an original input signal and to generate a trigger signal, that is provided to the integrator input, in response to the original input signal. The one-shot circuit is adapted to receive the original input signal and to generate the reset signal, that is provided to the reset input and that has a predetermined reset time period, in response to the original input signal. Charging operation of the integrating capacitor is enabled by the one-shot circuit only at the end of the reset time period. The delay circuit is adapted to receive the original input signal and to generate a delayed input signal by introducing a predetermined delay period into the original input signal, the delay period being longer than the reset time period. The control circuit is coupled to the delay circuit so as to receive the delayed input signal therefrom, and terminates generation of the trigger signal upon detection of a lagging edge of the delayed input signal.

BRIEF DESCRIPTION OF THE DRAWINGS

Other features and advantages of the present invention will become apparent in the following detailed description of the preferred embodiment with reference to the accompanying drawings, of which:

FIGS. 5A to 5F illustrate exemplary waveforms of an original input signal, a reset signal, a delayed input signal, a trigger signal, a latch output signal, and an integrator output signal generated in the circuit of FIG. 4.

DETAILED DESCRIPTION OF THE PREFERRED EMBODIMENT

Figure 1:
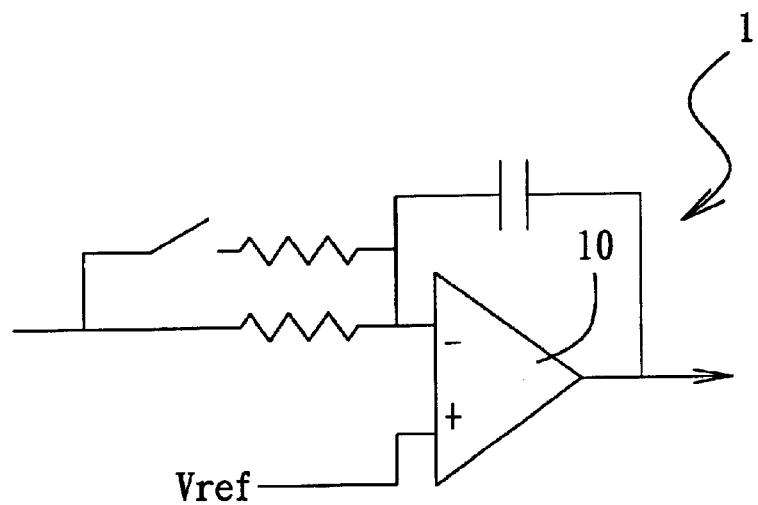
FIG. 1 illustrates a conventional dual-slope integrator.
Figure 2:
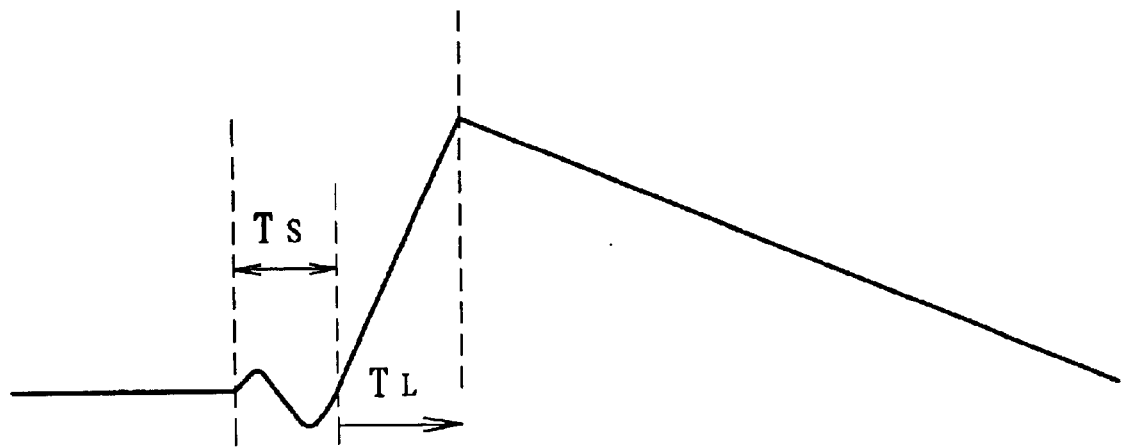
FIG. 2 illustrates an output waveform of the conventional dual-slope integrator.
Figure 3:
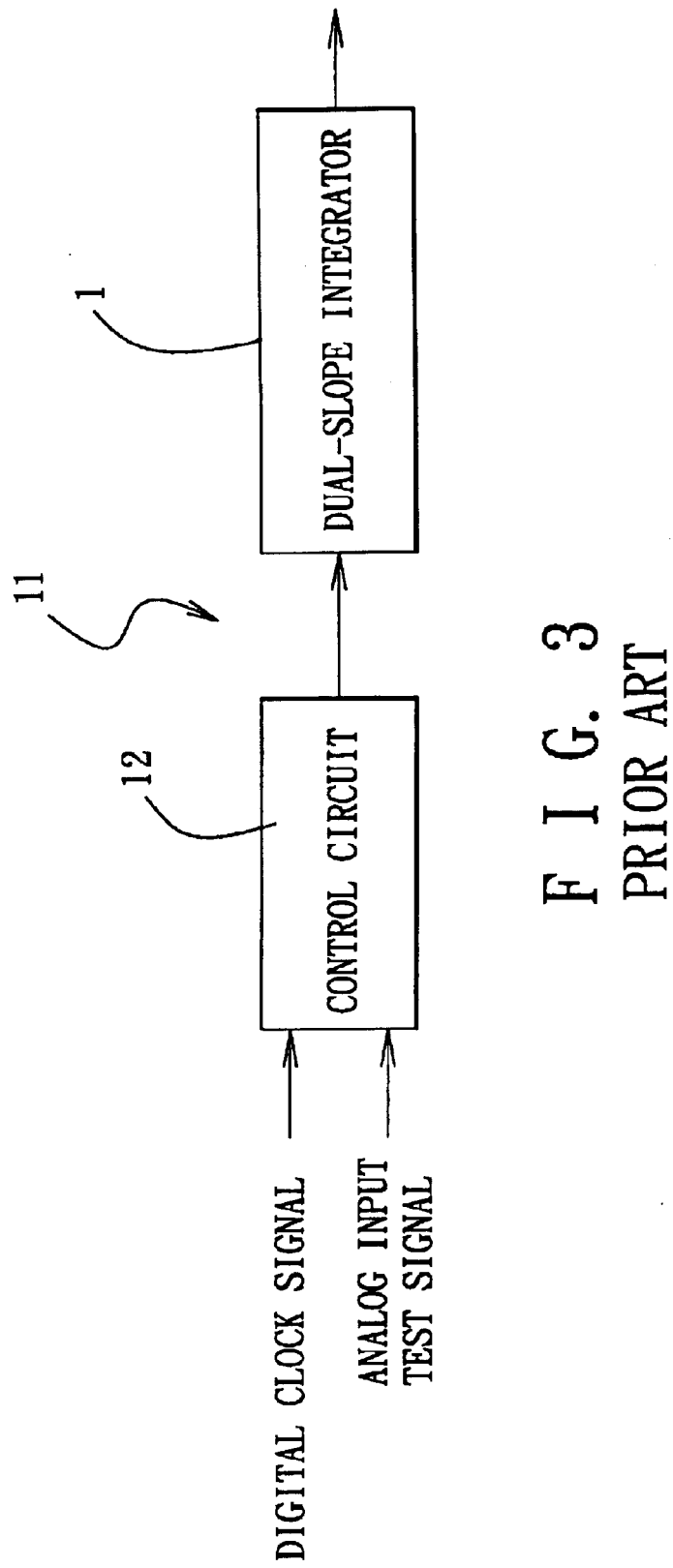
FIG. 3 is a block diagram of a conventional time interval measuring device.
Figure 4:
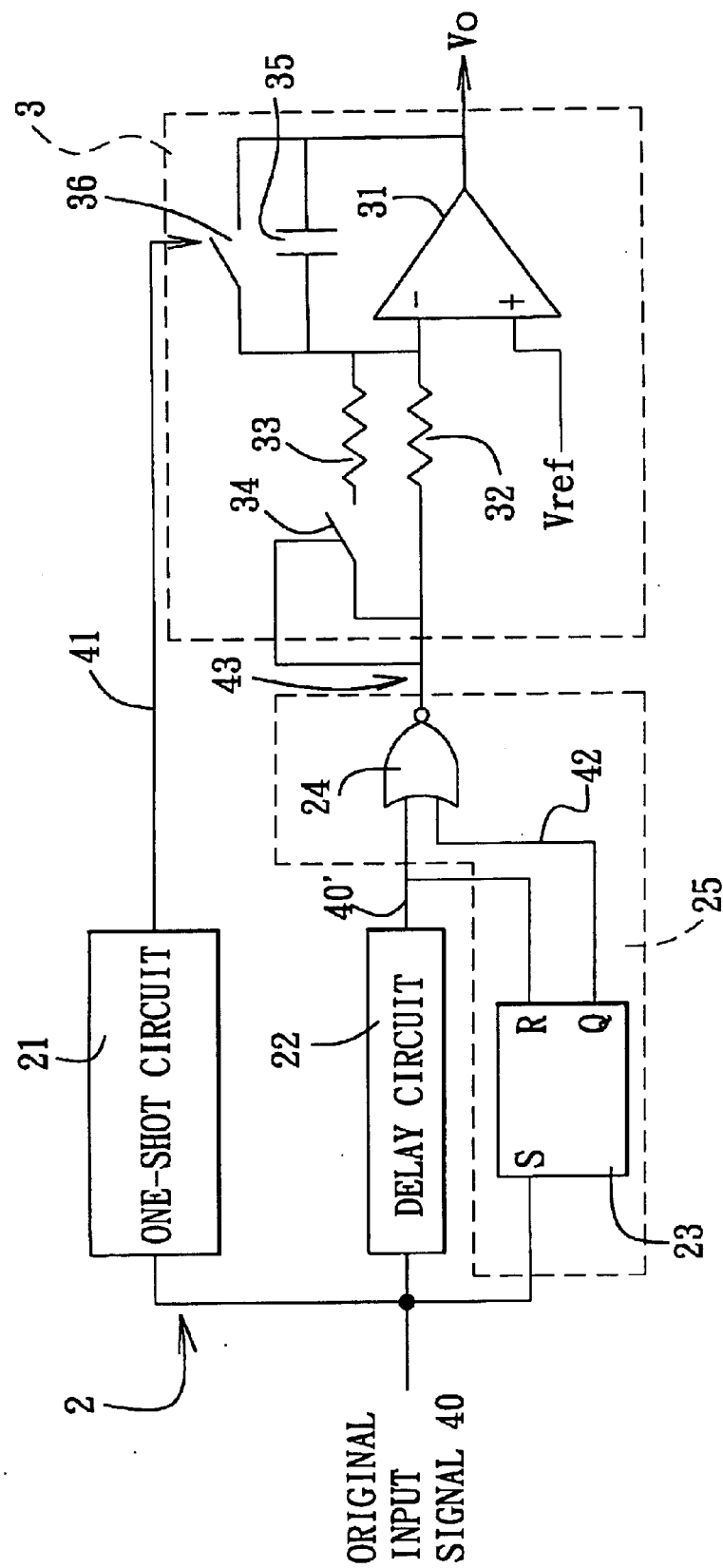
FIG. 4 is a circuit diagram of the preferred embodiment of an apparatus for controlling a dual-slope integrator circuit according to the present invention.

FIG. 4 illustrates the preferred embodiment of an apparatus 2 for controlling a dual-slope integrator circuit 3 to eliminate settling time effect according to the present invention. The integrator circuit 3 includes an operational amplifier 31, a first resistor 32, a second resistor 33, a slope control switch 34, an integrating capacitor 35, and a reset switch 36. The integrator circuit 3 further has a reset input for receiving a reset signal 41 that is used in controlling ON/OFF states of the reset switch 36 for controlling in turn a reset state of the integrating capacitor 35, an integrator input for receiving a signal 43 to be integrated, and an integrator output from which an integrator output signal (Vo) is obtained. The first resistor 32 has one end for receiving the signal 43, and another end connected to an inverting input of the operational amplifier 31. The second resistor 33 has one end for receiving the signal 43 through the slope control switch 34, and another end connected to the inverting input of the operational amplifier 31. The integrating capacitor 35 has one end connected to the inverting input of the operational amplifier 31, and another end connected to the output of the operational amplifier 31. The operational amplifier 31 further has a non-inverting input for receiving a reference voltage (Vref).

The apparatus 2 includes a one-shot circuit 21, a delay circuit 22, and a control circuit 25.

The one-shot circuit 21 is adapted to receive an original input signal 40 (see FIG. 5A), which is a pulse signal, and to generate the reset signal 41 (see FIG. 5B), that is provided to the reset input of the integrator circuit 3 for closing the reset switch 36 and that has a predetermined reset time period (Tz), in response to the original input signal 40. The integrating capacitor 35 is thus short-circuited by the reset switch 36 to maintain a reset state of the integrating capacitor 35 during the reset time period (Tz). Hence, the integrator output signal (Vo) (see FIG. 5F) is equal to the reference voltage (Vref) during the reset time period (Tz). The reset time period (Tz) is longer than a measured settling time (Ts) of the integrator circuit 3. At the end of the reset time period (Tz), the reset switch 36 is opened so that charging of the integrating capacitor 35 becomes possible.

The delay circuit 22 is adapted to receive the original input signal 40 and to generate a delayed input signal 40' (see FIG. 5C) by introducing a predetermined delay period (Td) into the original input signal 40. The delay period (Td) is longer than the reset time period (Tz) by a duration not smaller than the measured settling time (Ts) of the integrator circuit 3.

The control circuit 25 is adapted to receive the original input signal 40 and the delayed input signal 40' and to generate a trigger signal 43 (see FIG. 5D) that is provided to the integrator input of the integrator circuit 3 for enabling charging operation of the integrating capacitor 35 during a charging period that starts from the end of the reset time period (Tz) and that terminates at a lagging edge of the delayed input signal 40'. In this embodiment, the control circuit 25 includes an SR latch 23 and a logic NOR gate 24.

The SR latch 23 has a set terminal that serves as a first input terminal for receiving the original input signal 40, a reset terminal that serves as a second input terminal for receiving the delayed input signal 40', and an output terminal from which a latch output signal 42 (see FIG. 5E) is obtained.

The logic NOR gate 24 has a first input terminal for receiving the delayed input signal 40', a second input terminal coupled to the output terminal of the SR latch 23, and an output terminal from which the trigger signal 43 is obtained.

Accordingly, the control circuit 25 generates the trigger signal 43 starting from a leading edge of the original input signal 40 and terminating at the lagging edge of the delayed input signal 40'.

The method for controlling the dual-slope integrator circuit 3 according to the present invention comprises the following steps:

a) In response to the original input signal 40 (see FIG. 5A), the one-shot circuit 21 generates the reset signal 41 (see FIG. 5B) that is provided to the reset input of the integrator circuit 3 and that has a predetermined reset time period (Tz). The duration of the reset time period (Tz) must be longer than the settling time (Ts) of the integrator circuit 3. Due to the reset signal 41, the reset switch 36 short-circuits the integrating capacitor 35 during the reset time period (Tz) to disable charging operation of the integrating capacitor 35.

b) Simultaneous with step a), the delay circuit 22 generates the delayed input signal 40' (see FIG. 5C) by introducing a predetermined delay period (Td), which is longer than the reset time period (Tz) by a duration not smaller than the measured settling time (Ts) of the integrator circuit 3, into the original input signal 40.

c) Simultaneous with step a), since the original input signal 40 is received by the set terminal of the SR latch 23, since the delayed input signal 40' is received by the reset terminal of the SR latch 23, and since the delayed input signal 40' and the latch output signal 42 (see FIG. 5E) from the SR latch 23 are received by the logic NOR gate 24, the trigger signal 43 (see FIG. 5D) generated by the logic NOR gate 24 and provided to the integrator input of the integrator circuit 3 is a low logic signal having a duration ($T_2$) that starts from the leading edge of the original input signal 40 and that terminates at the lagging edge of the delayed input signal 40'.

As mentioned hereinabove, charging operation of the integrating capacitor 35 is not permitted by the reset switch 36 during the reset time period (Tz). However, at the end of the reset time period (Tz), the low-logic trigger signal 43 (i.e., the potential of which is lower than the reference voltage (Vref)) enables charging of the integrating capacitor 35 through a parallel combination of the first and second resistors 33, 34 (i.e., the low-logic trigger signal 43 closes the slope control switch 34) during a charging period that starts from the end of the reset time period (Tz) and that terminates at the lagging edge of the delayed input signal 40'. As shown in FIG. 5E, the charging period includes a pre-charging sub-period ($T_3$) that starts from the end of the reset time period (Tz) and that terminates at a leading edge of the delayed input signal 40', and an actual integrating sub-period ($T_4$) that follows the pre-charging sub-period ($T_3$) and that has a duration equal to that of the original input signal 40. The pre-charging sub-period ($T_3$) serves as a buffer period that is sufficient to ensure that the integrator circuit 3 has already settled down before the start of the actual integrating sub-period ($T_4$) for integrating the delayed input signal 40'. It is noted herein that the effect of charges that were accumulated in the integrating capacitor 35 during the pre-charging sub-period ($T_3$) may be subsequently removed through appropriate calibration techniques that are well known in the art. Thereafter, at the end of the charging period, the trigger signal 43 reverts to a high logic state (i.e., the potential thereof is predetermined to be higher than the reference voltage (Vref)). At this time, the integrating capacitor 35 of the integrator circuit 3 starts to discharge through the first resistor 32 (i.e., the high-logic trigger signal 43 opens the slope control switch 34). The integrating operation of the integrator circuit 3 for integrating the original input signal 40 is thus completed.

In sum, this invention provides a method and apparatus for controlling a dual-slope integrator circuit to eliminate settling time effect without the need for an input digital clock signal and a complicated finite-state control circuit, thereby further eliminating the problems of synchronization and cross-talk. Manufacturing costs can thus be reduced, and reliability can be enhanced in view of improved linearity of the dual-slope integrator circuit. While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A method for controlling a dual-slope integrator circuit, the integrator circuit having an integrating capacitor, a reset input for receiving a reset signal that is used in maintaining a reset state of the integrating capacitor, and an integrator input for receiving a signal to be integrated, said method comprising the steps of:

a) in response to an original input signal, generating the reset signal that is provided to the reset input and that has a predetermined reset time period;

b) simultaneous with step a), generating a delayed input signal by introducing a predetermined delay period into the original input signal, the delay period being longer than the reset time period; and c) with reference to the original input signal and the delayed input signal, generating a trigger signal that is provided to the integrator input for enabling charging operation of the integrating capacitor during a charging period that starts from the end of the reset time period and that terminates at a lagging edge of the delayed input signal.

2. The method as claimed in claim 1, wherein the original input signal is a pulse signal.

3. The method as claimed in claim 1, wherein the charging period includes a pre-charging sub-period that starts from the end of the reset time period and that terminates at a leading edge of the delayed input signal, and an actual integrating sub-period that follows the pre-charging sub-period and that has a duration equal to that of the original input signal.

4. The method as claimed in claim 3, wherein the pre-charging sub-period is longer than a measured settling time of the integrator circuit.

5. A method for controlling a dual-slope integrator circuit, the integrator circuit having an integrating capacitor, a reset input for receiving a reset signal that is used in maintaining a reset state of the integrating capacitor, and an integrator input for receiving a signal to be integrated, said method comprising the steps of:

a) in response to an original input signal, generating a trigger signal that is provided to the integrator input;

b) simultaneous with step a), generating the reset signal that is provided to the reset input and that has a predetermined reset time period such that charging operation of the integrating capacitor is enabled only at the end of the reset time period;

c) simultaneous with step a), generating a delayed input signal by introducing a predetermined delay period into the original input signal, the delay period being longer than the reset time period; and d) terminating generation of the trigger signal upon detection of a lagging edge of the delayed input signal.

6. The method as claimed in claim 5, wherein the original input signal is a pulse signal.

7. The method as claimed in claim 5, wherein the delay period is longer than the reset time period by a duration not smaller than a measured settling time of the integrator circuit.

8. An apparatus for controlling a dual-slope integrator circuit, the integrator circuit having an integrating capacitor, a reset input for receiving a reset signal that is used in maintaining a reset state of the integrating capacitor, and an integrator input for receiving a signal to be integrated, said apparatus comprising:

a one-shot circuit adapted to receive an original input signal and to generate the reset signal, that is provided to the reset input and that has a predetermined reset time period, in response to the original input signal;

a delay circuit adapted to receive the original input signal and to generate a delayed input signal by introducing a predetermined delay period into the original input signal, the delay period being longer than the reset time period; and a control circuit adapted to receive the original input signal and the delayed input signal and to generate a trigger signal that is provided to the integrator input for enabling charging operation of the integrating capacitor during a charging period that starts from the end of the reset time period and that terminates at a lagging edge of the delayed input signal.

9. The apparatus as claimed in claim 8, wherein said control circuit generates the trigger signal starting from a leading edge of the original input signal and terminating at the lagging edge of the delayed input signal.

10. The apparatus as claimed in claim 8, wherein said control circuit includes:

a latch having a first input terminal for receiving the original input signal, a second input terminal for receiving the delayed input signal, and an output terminal; and a logic gate having a first input terminal for receiving the delayed input signal, a second input terminal coupled to said output terminal of said latch, and an output terminal from which the trigger signal is obtained.

11. The apparatus as claimed in claim 10, wherein said latch is an SR latch having a set terminal that serves as said first input terminal and a reset terminal that serves as said second input terminal, and said logic gate is a logic NOR gate.

12. The apparatus as claimed in claim 8, wherein the charging period includes a pre-charging sub-period that starts from the end of the reset time period and that terminates at a leading edge of the delayed input signal, and an actual integrating sub-period that follows the pre-charging sub-period and that has a duration equal to that of the original input signal.

13. The apparatus as claimed in claim 12, wherein the pre-charging sub-period is longer than a measured settling time of the integrator circuit.

14. An apparatus for controlling a dual-slope integrator circuit, the integrator circuit having an integrating capacitor, a reset input for receiving a reset signal that is used in maintaining a reset state of the integrating capacitor, and an integrator input for receiving a signal to be integrated, said apparatus comprising:

a control circuit adapted to receive an original input signal and to generate a trigger signal, that is provided to the integrator input, in response to the original input signal;

a one-shot circuit adapted to receive the original input signal and to generate the reset signal, that is provided to the reset input and that has a predetermined reset time period, in response to the original input signal;

charging operation of the integrating capacitor being enabled by said one-shot circuit only at the end of the reset time period; and a delay circuit adapted to receive the original input signal and to generate a delayed input signal by introducing a predetermined delay period into the original input signal, the delay period being longer than the reset time period;

said control circuit being coupled to said delay circuit so as to receive the delayed input signal therefrom, and terminating generation of the trigger signal upon detection of a lagging edge of the delayed input signal.

15. The apparatus as claimed in claim 14, wherein said control circuit generates the trigger signal starting from a leading edge of the original input signal and terminating at the lagging edge of the delayed input signal.

16. The apparatus as claimed in claim 14, wherein said control circuit includes:

a latch having a first input terminal for receiving the original input signal, a second input terminal for receiving the delayed input signal, and an output terminal; and a logic gate having a first input terminal for receiving the delayed input signal, a second input terminal coupled to said output terminal of said latch, and an output terminal from which the trigger signal is obtained.

17. The apparatus as claimed in claim 16, wherein said latch is an SR latch having a set terminal that serves as said first input terminal and a reset terminal that serves as said second input terminal, and said logic gate is a logic NOR gate.

18. The method as claimed in claim 14, wherein the delay period is longer than the reset time period by a duration not smaller than a measured settling time of the integrator circuit.

* * * * *